United States Patent
Song

(10) Patent No.: US 9,270,275 B2
(45) Date of Patent: Feb. 23, 2016

(54) LEVEL SHIFTER AND SERIALIZER HAVING THE SAME

(71) Applicant: SK hynix Inc., Gyeonggi-do (KR)

(72) Inventor: Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 14/300,919

(22) Filed: Jun. 10, 2014

(65) Prior Publication Data

US 2015/0207506 A1    Jul. 23, 2015

(30) Foreign Application Priority Data

Jan. 20, 2014   (KR) .................. 10-2014-0006709

(51) Int. Cl.
*H03L 5/00* (2006.01)
*H03K 19/0185* (2006.01)
*H03K 17/16* (2006.01)

(52) U.S. Cl.
CPC .......... *H03K 19/0185* (2013.01); *H03K 17/161* (2013.01)

(58) Field of Classification Search
CPC .......................... H03K 19/0185; H03K 17/161

USPC .................. 327/306, 333; 326/61–62, 80–81
See application file for complete search history.

(56) References Cited

U.S. PATENT DOCUMENTS

| | | | | |
|---|---|---|---|---|
| 6,081,153 A * | 6/2000 | Hamada et al. | ................ | 327/333 |
| 6,717,448 B2 * | 4/2004 | Heo et al. | ...................... | 327/202 |
| 7,362,153 B2 * | 4/2008 | Sumesaglam | ................. | 327/202 |
| 7,411,420 B2 * | 8/2008 | Doi | ................................. | 326/82 |
| 7,834,662 B2 * | 11/2010 | Campbell et al. | ............... | 326/68 |

FOREIGN PATENT DOCUMENTS

KR    1020040098566    11/2004

* cited by examiner

*Primary Examiner* — Dinh Le
(74) *Attorney, Agent, or Firm* — IP & T Group LLP

(57) ABSTRACT

A level shifter includes a level shifting unit suitable for changing a swing voltage level of an input signal from a first swing voltage level to a second swing voltage level based on a clock signal, a precharging unit suitable for precharging an output node of the level shifting unit based on the clock signal, and an output unit suitable for latching a signal of the output node having the second swing voltage level to output as an output signal.

8 Claims, 3 Drawing Sheets

LEVEL SHIFTER AND SERIALIZER HAVING THE SAME

CROSS-REFERENCE TO RELATED APPLICATIONS

The present application claims priority of Korean Patent Application No. 10-2014-0006709, filed on Jan. 20, 2014, which is incorporated herein by reference in its entirety.

BACKGROUND

1. Field

Exemplary embodiments of the present invention relate to a semiconductor design technology, and more particularly, to a level shifter.

2. Description of the Related Art

A semiconductor integrated circuit may include a level shifter. The level shifter may be used for signal transmission between internal blocks using heterogeneous driving voltages. The level shifter may also adjust swing levels from an input signal to an output signal.

The level shifter may lower or raise the swing level of the input signal.

FIG. 1 is a diagram illustrating a conventional level shifter.

Referring to FIG. 1, the level shifter includes first and second PMOS transistors P1 and P2, first and second NMOS transistors N1 and N2, and an inverter 110.

The first NMOS transistor N1 receives an input signal IN, which swings between a first power voltage VDD1 (not illustrated) and a ground voltage VSS, through its gate. The second NMOS transistor N2 receives an inverted input signal INB, which is an inverted signal of the input signal IN that is inverted through the inverter 110, through its gate. The first and second NMOS transistors N1 and N2 are grounded at their sources.

The first PMOS transistor P1 is coupled to a drain of the first NMOS transistor N1 at its drain and coupled to a drain of the second NMOS transistor N2 at its gate. The second PMOS transistor P2 is coupled to the drain of the second NMOS transistor N2 at its drain and coupled to the drain of the first NMOS node N1 at its gate. The first and second PMOS transistors P1 and P2 are grounded at their sources.

The level shifter changes a swing range of the input signal IN from between the first power voltage VDD1 and the ground voltage VSS to between a second power voltage VDD2 and the ground voltage VSS. The second power voltage VDD2 has a voltage level higher than the first power voltage VDD1.

Operation of the level shifter with such cross-coupled latch scheme is as follows.

When the level of the input signal IN is changed from the ground voltage VSS to the first power voltage VDD1, the first NMOS transistor N1 is turned on and discharges a node MID, where the first PMOS transistor P1 is coupled to the drain of the second NMOS transistor N2 with its gate, to the ground voltage VSS. The second PMOS transistor P2 is coupled to the drain of the second NMOS transistor N2 with its drain. Due to the node MID being discharged to the ground voltage VSS, the second PMOS transistor P2 is turned on to drive an output node OUT to the second power voltage VDD2.

When the level of the input signal IN is changed from the ground voltage VSS to the first power voltage VDD1, the first NMOS transistor N1 receiving the input signal IN is turned on and the second NMOS transistor N2 receiving the inverted input signal INB is turned off, and thus the node MID is discharged to the ground voltage VSS.

At that time, the second PMOS transistor P2 is slightly turned on due to the voltage of the node MID and may not promptly raise the voltage of the output node OUT from the ground voltage VSS to the second power voltage VDD2, which turns on the first PMOS transistor P1. Thus, a through-current flowing from the second power voltage VDD2 to the ground voltage VSS is generated through the first NMOS transistor N1 turned on by the input signal IN and the turned-on first PMOS transistor P1, and thus generates a current-fighting. The current-fighting indicates a current crash between the through-current having the level of the second power voltage VDD2 through the first PMOS transistor P1 and a current having the level of the first power voltage VDD1 through the first NMOS transistor N1.

As a result, the voltage of the node MID is lowered because of the current driving difference between the two transistors. Thus, the second PMOS transistor P2 is turned on and the voltage level of the output node OUT is raised to the second power voltage VDD2. Furthermore, the first PMOS transistor P1 is turned off and the node MID is grounded.

When the voltage difference between the first and second power voltages VDD1 and VDD2 are great and the current sinking capability of the first and second NMOS transistors N1 and N2 is not enough, the voltage level of the node MID may not turn on the first PMOS transistor P1, and thus the level shifter may not transmit the expected signal. Further, the difference in the pull-up/pull-down capability may occur and duty error may increase due to process skew and the voltage difference between the first and second power voltages VDD1 and VDD2.

SUMMARY

Various embodiments of the present invention are directed to a level shifter that may perform precharging and level shifting based on a clock signal, and a serializer having the same.

In accordance with an embodiment of the present invention, a level shifter may include a level shifting unit suitable for changing a swing voltage level of an input signal from a first swing voltage level to a second swing voltage level based on a clock signal, a precharging unit suitable for precharging an output node of the level shifting unit based on the clock signal, and an output unit suitable for latching a signal of the output node having the second swing voltage level to output as an output signal.

In accordance with an embodiment of the present invention, a level shifter may include a level shifting unit suitable for changing a swing voltage level of an input signal from a first swing voltage level to a second swing voltage level based on a clock signal, a precharge driving unit suitable for precharging an output node of the level shifting unit based on the clock signal, a leakage current prevention unit suitable for switching a current path between the precharge driving unit and the output node based on a voltage level of the output node, and an output unit suitable for latching a signal of the output node having the second swing voltage level to output as an output signal.

In accordance with an embodiment of the present invention, a serializer may include a first level shifter suitable for receiving a rising data and a rising clock signal, and a second level shifter suitable for receiving falling data and falling clock signals. The first level shifter shares an output terminal with the second level shifter and includes a first level shifting unit suitable for changing a swing voltage level of a rising data from a first swing voltage level to a second swing voltage level based on a rising clock signal, a first precharge driving unit suitable for precharging a first output node of the first level shifting unit based on the clock signal, a first leakage current prevention unit suitable for switching a current path between the first precharge driving unit and the first output node based on a voltage level of the first output node, and a first output unit suitable for latching a signal of the first output node having the second swing voltage level to output as a first output signal.

In accordance with the embodiments of the present invention, the level shifter may perform precharging and level shifting based on a clock signal. Thus, the duty error may be reduced by removing the through-current. Also, the level shifter may reduce power consumption by removing a leakage current path.

DETAILED DESCRIPTION

Figure 1:
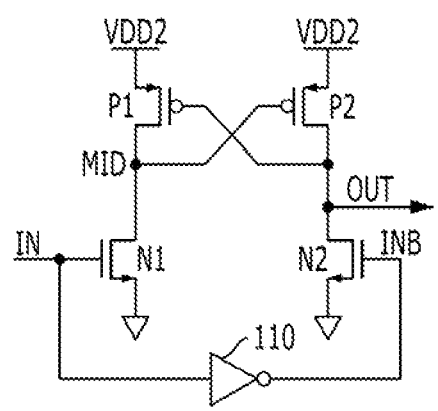
FIG. 1 is a diagram illustrating a conventional level shifter.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned.

Figure 2:
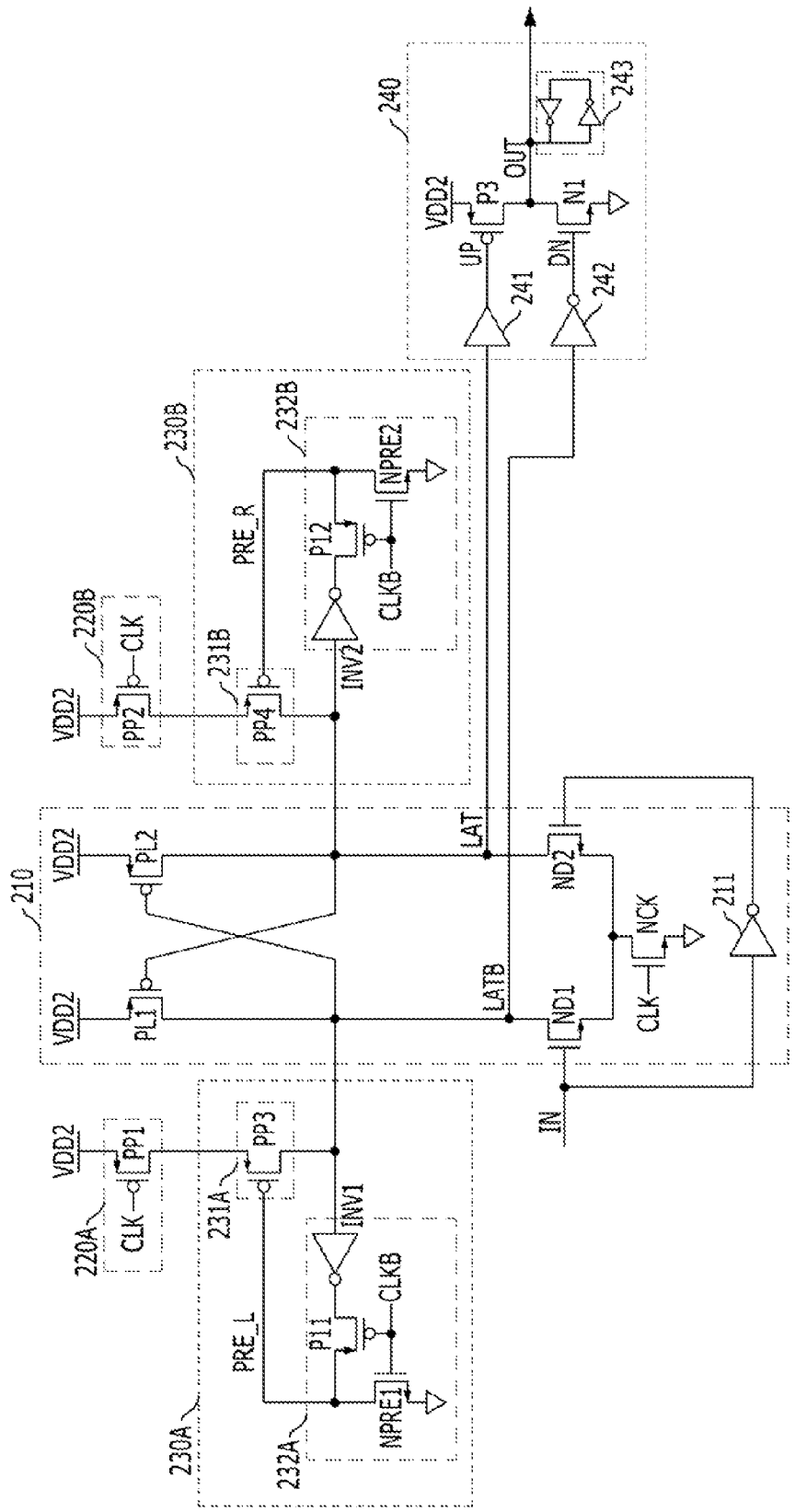
FIG. 2 is a diagram illustrating a level shifter in accordance with an embodiment of the present invention.

FIG. 2 is a diagram illustrating a level shifter in accordance with an embodiment of the present invention.

Referring FIG. 2, the level shifter may include a level shifting unit 210, precharging units 220A, 220B, 230A and 230B and an output unit 240.

The level shifting unit 210 may change a swing voltage level of an input signal IN from a first swing voltage level to a second swing voltage level. The first swing voltage level is a voltage level swinging from a first power voltage VDD1 to a ground voltage VSS, and the second swing voltage level is the voltage level swinging from a second power voltage VDD2 and the ground voltage VSS. The first and second swing voltage level may vary.

The level shifting unit 210 may include first and second load PMOS transistors PL1 and PL2, first to third NMOS transistors ND1, ND2 and NCK and an inverter 211.

The input signal IN and an inverted input signal INB, which is an inverted signal of the input signal IN that is inverted by the inverter 211, are input to the first and second NMOS transistors ND1 and ND2 and thus first and second output nodes LATB and LAT may have levels complementary to each other.

The level shifting unit 210 may operate based on a clock signal CLK. When the clock signal CLK has a high level, the first and second load PMOS transistors PL1 and PL2 may be turned off and the level of one of the first and second output nodes LATB and LAT may be changed to a logic low (e.g., VSS) according to the level of the input signal IN. Therefore, the changed level of one of the first and second output nodes LATB and LAT may be output as an output signal OUT having the second swing voltage level through the output unit 240.

In other words, the level shifting unit 210 may change the swing voltage level of the input signal IN from the first swing voltage level to the second swing voltage level and output the input signal IN having the changed swing voltage level.

The precharging units 220A, 220B, 230A and 230B may include first and second precharge driving units 220A and 220B and first and second leakage current prevention units 230A and 230B.

The first and second precharge driving units 220A and 220B may precharge the first and second output nodes LATB and LAT of the level shifting unit 210 based on the clock signal CLK. The first and second precharge driving units 220A and 220B may include the first precharge driving unit 220A suitable for precharging the first output node LATB during a precharge operation and the second precharge driving unit 220B suitable for precharging the second output node LAT during the precharge operation.

The first and second precharge driving units 220A and 220B may include first and second PMOS transistors PP1 and PP2, which precharge the first and second output nodes LATB and LAT based on the clock signal CLK, respectively. The first precharge driving unit 220A including the first PMOS transistor PP1 may be coupled between the second power voltage VDD2 and the first leakage current prevention unit 230A. The second precharge driving unit 220B including the second PMOS transistor PP2 may be coupled between the second power voltage VDD2 and the second leakage current prevention unit 230B.

The first and second leakage current prevention units 230A and 230B may respectively switch current paths between the first and second precharge driving units 220A and 220B and the first and second output nodes LATB and LAT by receiving the voltage levels of the first and second output nodes LATB and LAT as feedback.

The first leakage current prevention unit 230A may be coupled between the first output node LATB and the first precharge driving unit 220A and may establish a current path such that the first precharge driving unit 220A precharges the first output node LATB based on the clock signal CLK. The second leakage current prevention unit 230B may be coupled between the second output node LAT and the second precharge driving unit 220B and may establish a current path such that the second precharge driving unit 220B precharges the second output node LAT based on the clock signal CLK.

The configuration and operation of the second leakage current prevention unit 230B is similar to the first leakage current prevention unit 230A and thus only the first leakage current prevention unit 230A will be described in detail.

The first leakage current prevention unit 230A may include a first switching block 231A and a first switching control block 232A. The first switching block 231A may include a third PMOS transistor PP3, may be coupled between the first precharge driving unit 220A and the first output node LATB, and may perform a switching operation. The first switching block 231A may switch the current path between the first precharge driving unit 220A and the first output node LATB through the switching operation. The first switching control block 232A may control the first switching block 231A based on the voltage level of the first output node LATB. The first switching control block 232A may include an inverter INV11, a switching PMOS transistor P11 and a precharging NMOS transistor NPRE1. The inverter INV11 may invert the voltage level of the first output node LATB. The switching PMOS transistor P11 and the precharging NMOS transistor NPRE1 may generate a first switching control signal PRE_L based on an inverted clock signal (or a complementary clock signal) CLKB. Similarly, a first switching control block 232B included in the second leakage current prevention unit 230B may include an inverter INV12, a switching PMOS transistor P12 and a precharging NMOS transistor NPRE2. The inverter INV12 may invert the voltage level of the second output node LAT. The switching PMOS transistor P12 and the precharging NMOS transistor NPRE2 may generate a second switching control signal PRE_R.

The operation of the level shifter in accordance with the embodiment of the present invention will be described in detail.

When the clock signal CLK has the low level, all of the first and second PMOS transistors PP1 and PP2 of the first and second precharge driving units 220A and 220B and the third and fourth PMOS transistors PP3 and PP4, which are the first and second switching blocks 231A and 231B of the first and second leakage current prevention units 230A and 230B, may be turned on, the first and second output nodes LATB and LAT may be precharged to have the high level and the first and second load PMOS transistors PL1 and PL2 may be fully turned off.

Conversely, when the clock signal CLK has the high level, all of the first to fourth PMOS transistors PP1, PP2, PP3 and PP4 of the first and second precharge driving units 220A and 220B and the first and second leakage current prevention units 230A and 230B, may be turned off and one of the first and second output nodes LATB and LAT may be level-shifted to have the low level according to the logic level of the input signal IN. At that moment, the first and second load PMOS transistors PL1 and PL2 may remain turned off and thus the pull-up/pull-down current fighting may be prevented. Therefore, the input signal IN may be transferred at the same time regardless of the level of the input signal IN. The output unit 240 may change the value of the output signal OUT by changing up and down signals UP and DN therein according to statuses of the first and second output nodes LATB and LAT. The output unit 240 will be described in detail later.

When the clock signal CLK has the high level, which is the level of the first power voltage VDD1 and thus has a different voltage level than the second power voltage VDD2, the first and second PMOS transistors PP1 and PP2 of the first and second precharge driving units 220A and 220B may not be fully turned off, which may cause current leakage in the first and second PMOS transistors PP1 and PP2. In accordance with the embodiment of the present invention, the current leakage may be prevented by the first and second leakage current prevention units 230A and 230B.

For example, when the input signal IN is input with the high level, the first NMOS transistor ND1 may be turned on, the first output node LATB may have the low level, the second NMOS transistor ND2 may be turned off and the second output node LAT may keep having the high level.

When the first output node LATB has the low level, the first switching control signal PRE_L may be changed to have the high level by an inverter of the first switching control block 232A. At this moment, the inverter of the first switching control block 232A may have the level of the second power voltage VDD2. Therefore, the first switching control signal PRE_L may have the level of the second power voltage VDD2 and the third PMOS transistor PP3 of the first switching block 231A may be fully turned off by the first switching control signal PRE_L. Therefore, the leakage current path may be completely switched.

The third and fourth PMOS transistors PP3 and PP4 of the first and second switching blocks 231A and 231B may be fully turned off according to the status of the input signal IN and thus the current leakage may be switched even though the first and second PMOS transistors PP1 and PP2 of the first and second precharge driving units 220A and 220B stay turned on.

The output unit 240 may include a buffer 241, an inverter 242, a PMOS transistor P3, a NMOS transistor N1 and a latch block 243.

The inverter 242 and the buffer 241 may receive the output signals of the first output node LATB and the second output node LAT, respectively.

The up signal UP output from the buffer 241 may be input to a gate of the PMOS transistor P3. The down signal DN output from the inverter 242 may be input to a gate of the NMOS transistor N1. From a connection node, at which a drain of the PMOS transistor P3 and a drain of the NMOS transistor N1 are coupled to each other, the output signal OUT may be output. Sources of the PMOS transistor P3 and the NMOS transistor N1 may be coupled to the second power voltage VDD2 and the ground voltage VSS, respectively. The output signal OUT may be latched and output by the latch block 243.

When the clock signal CLK has the low level and the first and second output nodes LATB and LAT may be precharged to have the high level through the precharge operation, the PMOS transistor P3 and the NMOS transistor N1 may be turned off by the up and down signals UP and DN output from the buffer 241 and the inverter 242 and the latch block 243 may maintain a previous value of the output signal OUT and may not output the output signal OUT.

Conversely, when the clock signal has the high level, one of the first and second output nodes LATB and LAT may transition to the low level and accordingly the output signal OUT may be output.

Signal transfer time for transfer of a signal from the first output node LATB to the output node OUT should be the same as from the second output node LAT to the output node OUT regardless of the high or low level of the input signal IN. Otherwise, duty error of the output signal OUT may occur.

The buffer 241 and the inverter 242 may prevent the duty error of the output signal OUT, and conversion times for converting the output signal of the second output node LAT into the up signal UP and the output signal of the first output node LATB into the down signal DN may be adjusted.

In accordance with the embodiment of the present invention, the level shifter may prevent the pull-up/pull-down current fighting and perform the level shifting without the duty error by generating the output signal through the precharge operation regardless of the previous status of the data. Further, the level shifter may reduce power consumption by removing the leakage current of the precharge path through the first and second leakage current prevention units 230A and 230B.

In accordance with the embodiment of the present invention, the level shifter may serve as a level shifter of a low frequency signal by applying a pulse instead of the clock signal CLK.

As another embodiment of the present invention, without the third and fourth PMOS transistors PP3 and PP4 which are the first and second switching blocks 231A and 231B of the first and second leakage current prevention units 230A and 230B, the first and second control signals PRE_L and PRE_R of the first and second switching control blocks 232A and 232B may control the first and second precharge driving units 220A and 220B for prevention of the leakage currents.

Figure 3:
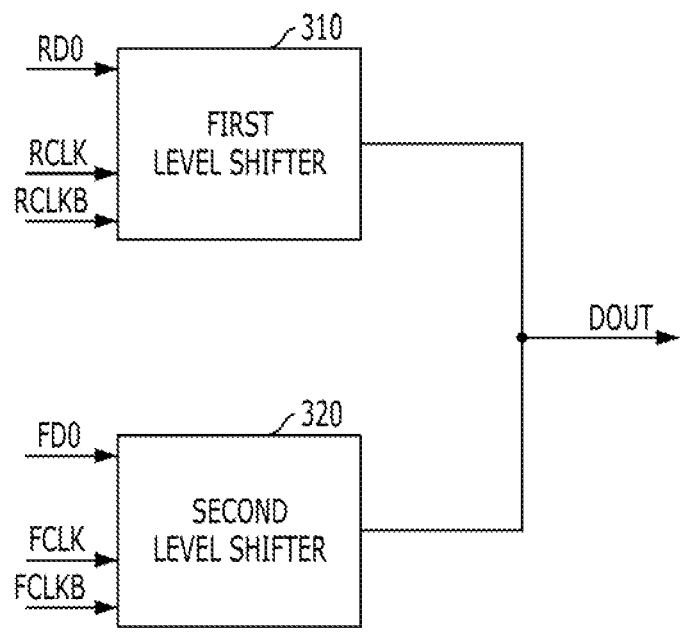
FIG. 3 is a block diagram illustrating a serializer including the level shifter in accordance with an embodiment of the present invention.

FIG. 3 is a block diagram illustrating a serializer including the level shifter in accordance with the embodiment of the present invention.

Referring to FIG. 3, the serializer may include a first level shifter 310 and a second level shifter 320, which have a common output terminal.

Each of the first and second level shifters 310 and 320 may be the level shifter shown in and described with reference to FIG. 2.

The first level shifter 310 may operate by receiving a rising data RD0, and rising clock signals RCLK and RCLKB. The second level shifter 320 may operate by receiving a falling data FD0, and falling clock signals FCLK and FCLKB. The rising data RD0 may input in response to the rising clock signals RCLK and RCLKB and the falling data FD0 may input in response to the falling clock signals FCLK and FCLKB.

The serializer may serialize and output the rising and falling data RD0 and FD0 input at rising and falling edges of the clock signals.

In general, a double data rate (DDR) system outputs data with the double data rate while internally operating with a single data rate in order to secure internal timing margin. For example, the output data rate may be 2 Gbps while the internal data rate being 1 Gbps. Most of such circuits output data at clock high duration.

The serializer having the level shifter in accordance with the embodiment of the present invention may output data at clock high duration, which may reduce the power consumption and the required circuit area and prevent duty error.

While the present invention has been described with respect to the specific embodiments, it will be apparent to those skilled in the art that various changes and modifications may be made without departing from the spirit and scope of the invention as defined in the following claims.

For example, the first and second precharge driving units 220A and 220B may include a PMOS transistor, and the types and dispositions of the logic gates and the transistors may vary according to activation polarities of the signals to be used, all of which will be obvious to those skilled in the art and would fall under the scope of the present invention.

What is claimed is:

1. A level shifter comprising:
    a level shifting unit configured to change a swing voltage level of an input signal from a first swing voltage level to a second swing voltage level based on a clock signal;
    a precharge driving unit configured to precharge an output node of the level shifting unit based on the clock signal;
    a leakage current prevention unit configured to switch a current path between the precharge driving unit and the output nodes based on a voltage level of the output node; and
    an output unit configured to latch a signal of the output node having the second swing voltage level to output as an output signal.

2. The level shifter of claim 1, wherein the output node of the level shifting unit comprises first and second output nodes having first and second output levels, respectively, which are complementary to each other, according to a logic level of an input signal.

3. The level shifter of claim 2, wherein the precharge driving unit comprises first and second precharge driving units respectively precharging the first and second output nodes during a precharge operation.

4. The level shifter of claim 3, wherein the leakage current prevention unit comprises:
    a first leakage current prevention unit coupled between the first output node and the first precharge driving unit, and configured to switch a first current path; and
    a second leakage current prevention unit coupled between the second output node and the second precharge driving unit, and configured to switch a second current path.

5. The level shifter of claim 4, wherein the first leakage current prevention unit comprises:
    a first switching block coupled between the first output node and the first precharge driving unit; and
    a first switching control block configured to control the first switching block according to a voltage level of the first output node.

6. The level shifter of claim 5, wherein the second leakage current prevention unit comprises:
    a second switching block coupled between the second output node and the second precharge driving unit; and
    a second switching control block configured to control the second switching block according to a voltage level of the second output node.

7. A serializer comprising:
    a first level shifter configured to receive a rising data and a rising clock signal; and
    a second level shifter configured to receive a falling data and a falling clock signals,
    wherein the first level shifter shares an output terminal with the second level shifter and comprises:
        a first level shifting unit configured to change a swing voltage level of a rising data from a first swing voltage level to a second swing voltage level based on a rising clock signal;
        a first precharge driving unit configured to precharge a first output node of the first level shifting unit based on the clock signal;
        a first leakage current prevention unit configured to switch a current path between the first precharge driving unit and the first output node based on a voltage level of the first output node; and
    a first output unit suitable configured to latch a signal of the first output node having the second swing voltage level to output as a first output signal.

8. The serializer of claim 7, wherein the second level shifter comprises:
    a second level shifting unit configured to change a swing voltage level of a falling data from a first swing voltage level to a second swing voltage level based on a falling clock signal;
    a second precharge driving unit configured to precharge a second output node of the second level shifting unit based on the clock signal;
    a second leakage current prevention unit configured to switch a current path between the second precharge driving unit and the second output node based on a voltage level of the second output node; and
    a second output unit configured to latch a signal of the second output node having the second swing voltage level to output as a second output signal.

* * * * *